(12) United States Patent
Akamatsu et al.

(10) Patent No.: US 12,165,693 B2
(45) Date of Patent: Dec. 10, 2024

(54) CIRCUITRY INCLUDING A LEVEL SHIFTER AND LOGIC, CONFIGURED TO RECEIVE A POWER UP RESET SIGNAL, AND ASSOCIATED METHODS, DEVICES, AND SYSTEMS

(71) Applicant: Micron Technology, Inc., Boise, ID (US)

(72) Inventors: Hiroshi Akamatsu, Boise, ID (US); Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 17/457,570

(22) Filed: Dec. 3, 2021

(65) Prior Publication Data

US 2023/0178141 A1 Jun. 8, 2023

(51) Int. Cl.
*G11C 11/408* (2006.01)
*G11C 11/4093* (2006.01)
*H03K 3/037* (2006.01)
*H03K 19/0185* (2006.01)

(52) U.S. Cl.
CPC ...... *G11C 11/4085* (2013.01); *G11C 11/4093* (2013.01); *H03K 3/037* (2013.01); *H03K 19/018521* (2013.01)

(58) Field of Classification Search
CPC ............ G11C 11/4093; G11C 11/4085; H03K 19/0185; H03K 3/037
USPC ...................................................... 365/189.11
See application file for complete search history.

(56) References Cited

U.S. PATENT DOCUMENTS

| | | | | |
|---|---|---|---|---|
| 5,751,651 | A * | 5/1998 | Ooishi | G11C 7/14 326/121 |
| 7,868,605 | B1 * | 1/2011 | Liu | G11C 5/147 323/284 |
| 2001/0010480 | A1 * | 8/2001 | Kato | G05F 1/465 327/546 |
| 2006/0192607 | A1 * | 8/2006 | Chun | H02M 1/36 327/536 |
| 2008/0313418 | A1 * | 12/2008 | Kwon | G11C 7/22 711/E12.001 |

* cited by examiner

*Primary Examiner* — Sung Il Cho
(74) *Attorney, Agent, or Firm* — TraskBritt

(57) ABSTRACT

A device may include a level shifter including an at least one input and at least one output. The device may also include a logic circuit coupled to an output of the at least one output of the level shifter and configured to receive a power up reset signal. The logic circuit may be configured to isolate an output of the logic circuit from a supply voltage responsive to the power up reset signal and during at least a portion of a power up sequence. Associated circuits, systems, and methods are also disclosed.

20 Claims, 13 Drawing Sheets

CIRCUITRY INCLUDING A LEVEL SHIFTER AND LOGIC, CONFIGURED TO RECEIVE A POWER UP RESET SIGNAL, AND ASSOCIATED METHODS, DEVICES, AND SYSTEMS

TECHNICAL FIELD

Embodiments of the disclosure relate to circuitry including a level shifter. More specifically, various embodiments relate to circuitry including a level shifter and logic for reducing crossing current, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

DETAILED DESCRIPTION

Figure 1:
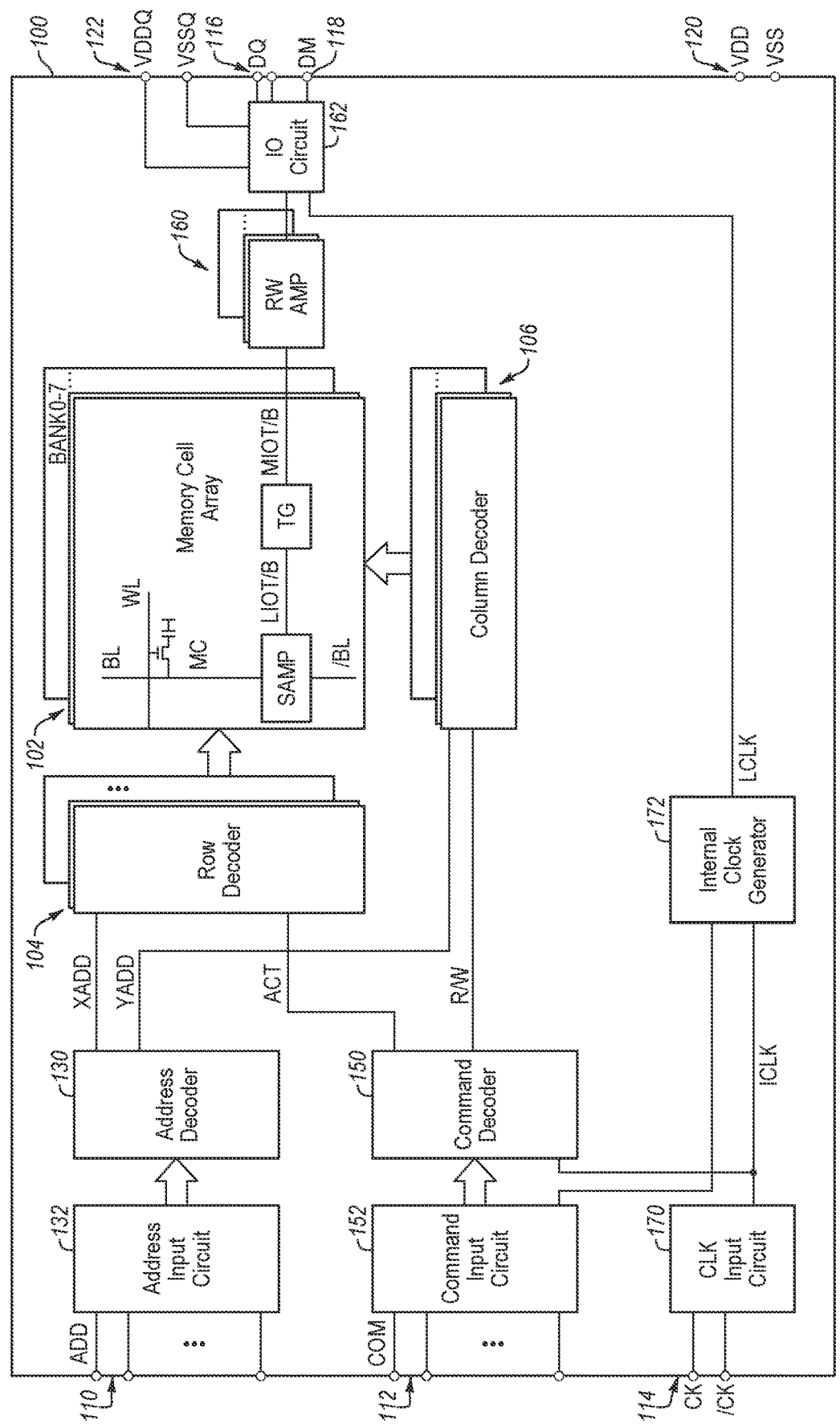
FIG. 1 is a block diagram of an example memory device, according to various embodiments of the disclosure.

Memory typically includes many memory cells arranged in a two-dimensional array of intersecting rows and columns. Data is written to or retrieved from the memory cells by selectively by applying activation voltages to word lines (i.e., access lines) and bit lines (i.e., data lines). In general, word lines activate memory cells and bit lines provide data to or retrieve data from the activated memory cells.

When memory access is desired, an activation voltage may be applied to a word line by a word line driver to enable a desired function (e.g., read or write) to be performed. More particularly, when an activation voltage (e.g., a high voltage) is applied via a word line, circuitry (e.g., a passgate transistor) in a memory cell may enable a bit line to write data to or retrieve data from the activated memory cell. When memory access is not needed, the word line driver may apply a deactivation voltage (e.g., a low voltage or ground voltage).

In some conventional devices (e.g., memory devices), crossing current may exist at an inverter coupled to an output of a level shifter (e.g., of a main word line driver). More specifically, as described more fully below, during a power up sequence of a memory device, due to the behavior of a power up reset signal and an output of a level shifter, both PMOS and NMOS transistors of an inverter may turn on, resulting in undesired crossing current.

Various embodiments disclosed herein relate to circuitry including a level shifter coupled to logic, which may be configured to reduce, and possibly eliminate, crossing current during a power up sequence. More specifically, the circuitry may include a level shifter including at least one input and at least one output. The circuitry may also include logic (e.g., a NOR gate) coupled to an output of the at least one output of the level shifter. The logic may also be configured to receive a power up reset signal in response to a power up sequence. The logic may further be configured to isolate an output of the logic from a supply voltage during at least a portion of the power up sequence. For example, the logic may include a transistor (e.g., a PMOS transistor) coupled between the output of the logic and the supply voltage and configured to turn OFF (i.e., to isolate the output of the logic from the supply voltage) responsive to a voltage of the power up reset signal received at a gate of the transistor reaching a specific voltage level. According to some embodiments, a word line driver (e.g., of a memory device) may include the level shifter and the logic.

According to another embodiment, a method may include generating, via a level shifter, an output signal responsive to an input signal. The method may further include receiving, at a logic device (e.g., a NOR gate), the output signal, and receiving, at the logic device, a power up reset signal responsive to initiation of a power up sequence. Further, the method may include isolating an output of the logic device from a supply voltage during at least a portion of the power up sequence. For example, isolating the output of the logic device from the supply voltage may include turning OFF a transistor (e.g., a PMOS transistor) coupled between the output of the logic device and the supply voltage (e.g., responsive to a voltage of the power up reset signal received at a gate of the transistor reaching a specific voltage level).

Although various embodiments are described herein with reference to memory devices, the disclosure is not so limited, and the embodiments may be generally applicable to microelectronic devices that may or may not include semiconductor devices and/or memory devices. Further, although various embodiments are described herein with reference to word line drivers, the disclosure is not so limited, and the embodiments may be generally applicable to circuits that may or may not be part of a word line driver or a memory device. Embodiments of the disclosure will now be explained with reference to the accompanying drawings.

FIG. 1 includes a block diagram of an example memory device 100, according to various embodiments of the disclosure. Memory device 100 may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and /BL, and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 160 over complementary local data lines (LIOT/B), transfer gate (TG), and complementary main data lines (MIOT/B). Conversely, write data outputted from read/write amplifiers 160 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to be receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal RAY may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 160, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 160, transfer gate TG, and sense amplifier SAMP. The write data may be written to memory cell MC specified by row address XADD and column address YADD.

Clock signals CK and /CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

Figure 2A:
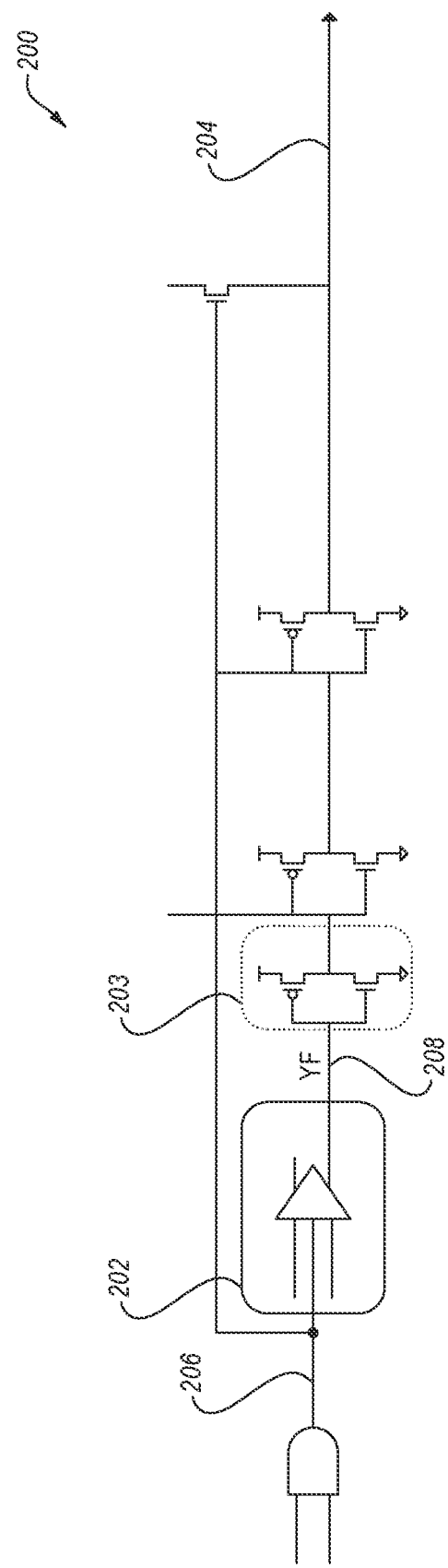
FIG. 2A depicts circuitry of a main word line driver of a memory device.

FIG. 2A depicts circuitry 200 of a main word line driver of a memory device. Circuitry 200, which includes a level shifter 202 and an inverter 203, is configured to generate a signal 204, which may be a control signal (e.g., for driving a word line). As will be appreciated, level shifter 202 may include a number of transistors (not shown) (e.g., a number of PMOS transistors of a cross coupled latch, and a number of NMOS transistors to flip the latch) and an inverter (not shown). Level shifter 202 is configured to receive a signal 206 and generate a signal 208 ("YF"). For example, level shifter 202 may convert a signal at one voltage (e.g., 1 volt) to another voltage (e.g., a supply voltage VCCP (e.g., 3 volts)).

Figure 2B:
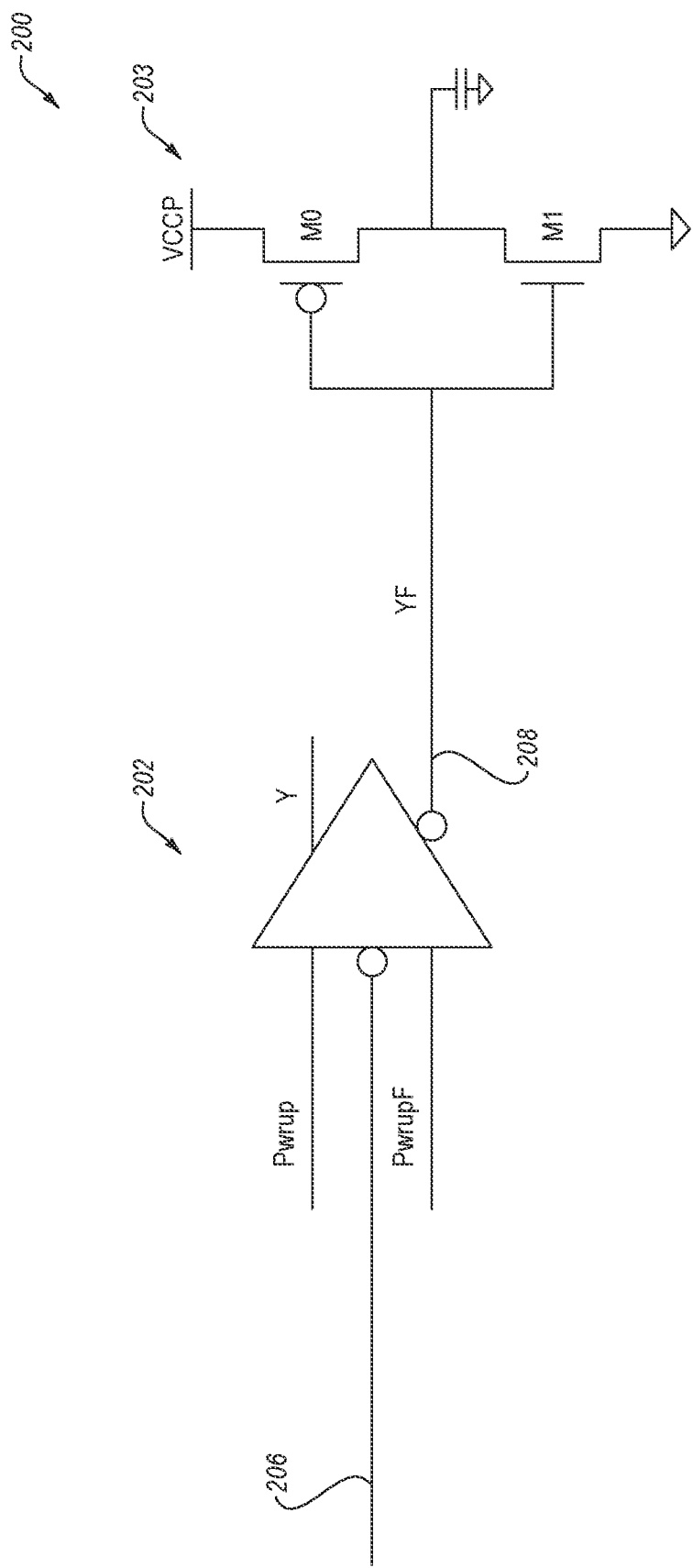
FIG. 2B depicts circuitry including a level shifter and an inverter.

FIG. 2B depicts a portion of circuitry 200 including level shifter 202 and inverter 203. As depicted in FIG. 2B, inverter 203 includes a PMOS transistor M0 and an NMOS transistor M1. Transistor M0 is coupled to supply voltage VCCP and transistor M1, which is further coupled to ground. As noted above, level shifter 202 is configured to receive signal 206 and generate signal YF, which may be received at a gate of transistor M0 and a gate of transistor M1. Level shifter 202 is also configured to receive power up signals Pwrup and PwrupF and generate signal a signal Y, which is the inverse of signal YF.

Figure 3A:
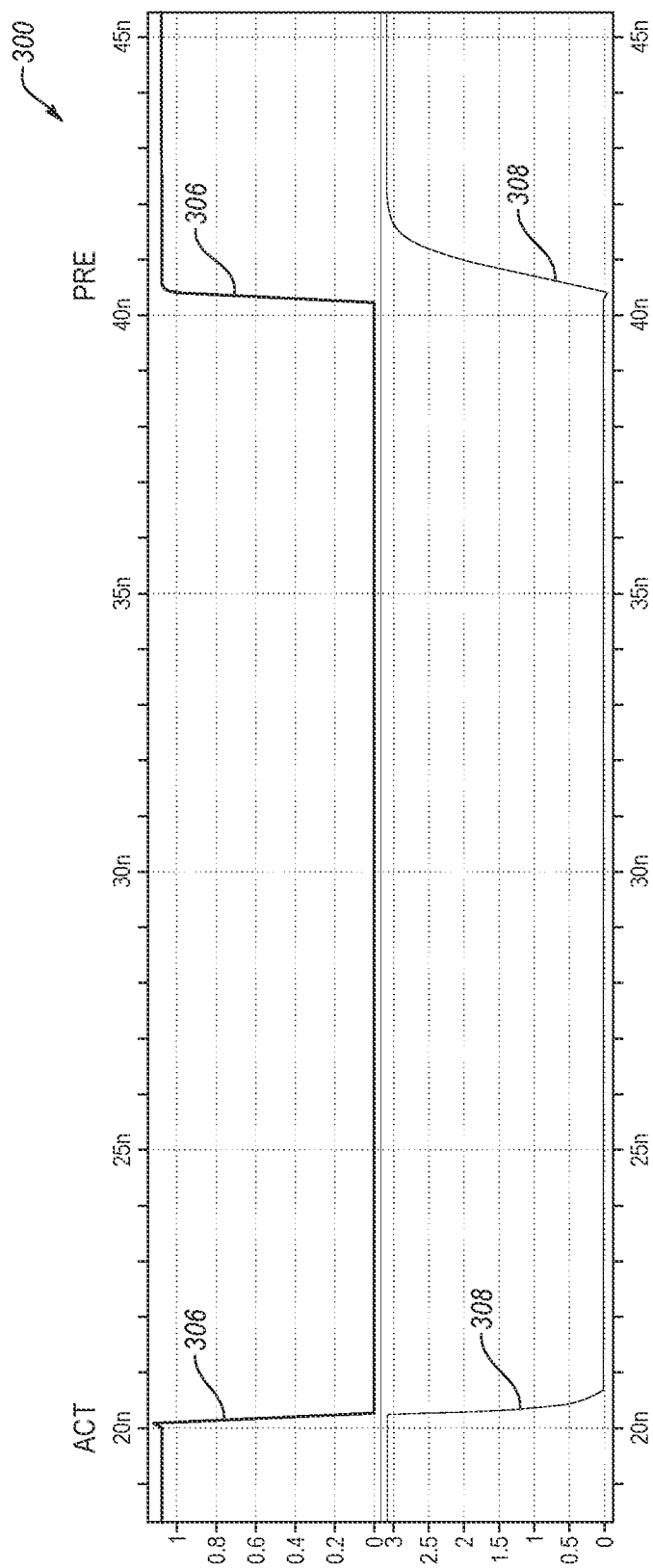
FIG. 3A is a plot including a signal representing an input of the level shifter of FIG. 2B and a signal representing an output of the level shifter of FIG. 2B.

FIG. 3A is a plot 300 including a signal 306, which represents an input (i.e., signal 206) of level shifter 202, and a signal 308, which represents an output (i.e., signal 208 "YF") of level shifter 202. As will be appreciated, in response to signal 306 transitioning from HIGH to LOW, signal 308 (YF) may transition from HIGH to LOW and a signal Y (not shown in FIG. 3A) may transition from LOW to HIGH. For example, during an active period (e.g., of a memory device), signal 306 and signal 308 may be LOW (and a signal Y may be HIGH), and during a precharge period (e.g., of the memory device), signal 306 and signal 308 may be HIGH (and a signal Y may be LOW).

As will be appreciated, because a slew rate of signal YF transitioning from HIGH to LOW is faster than a slew rate of signal Y transitioning from LOW to HIGH (i.e., due to signal YF pull-down being controlled by NMOS pull-down devices and signal Y pull-up being controlled by PMOS pull-up devices, which are weaker than NMOS devices), and due to the strict tRCD timing specification, signal YF is conveyed from level shifter 202 to inverter (i.e., rather than signal Y). Further, as will also be appreciated, the slew rate of signal YF transitioning from LOW to HIGH is sufficient due to the margin of the tRP timing specification.

Figure 3B:
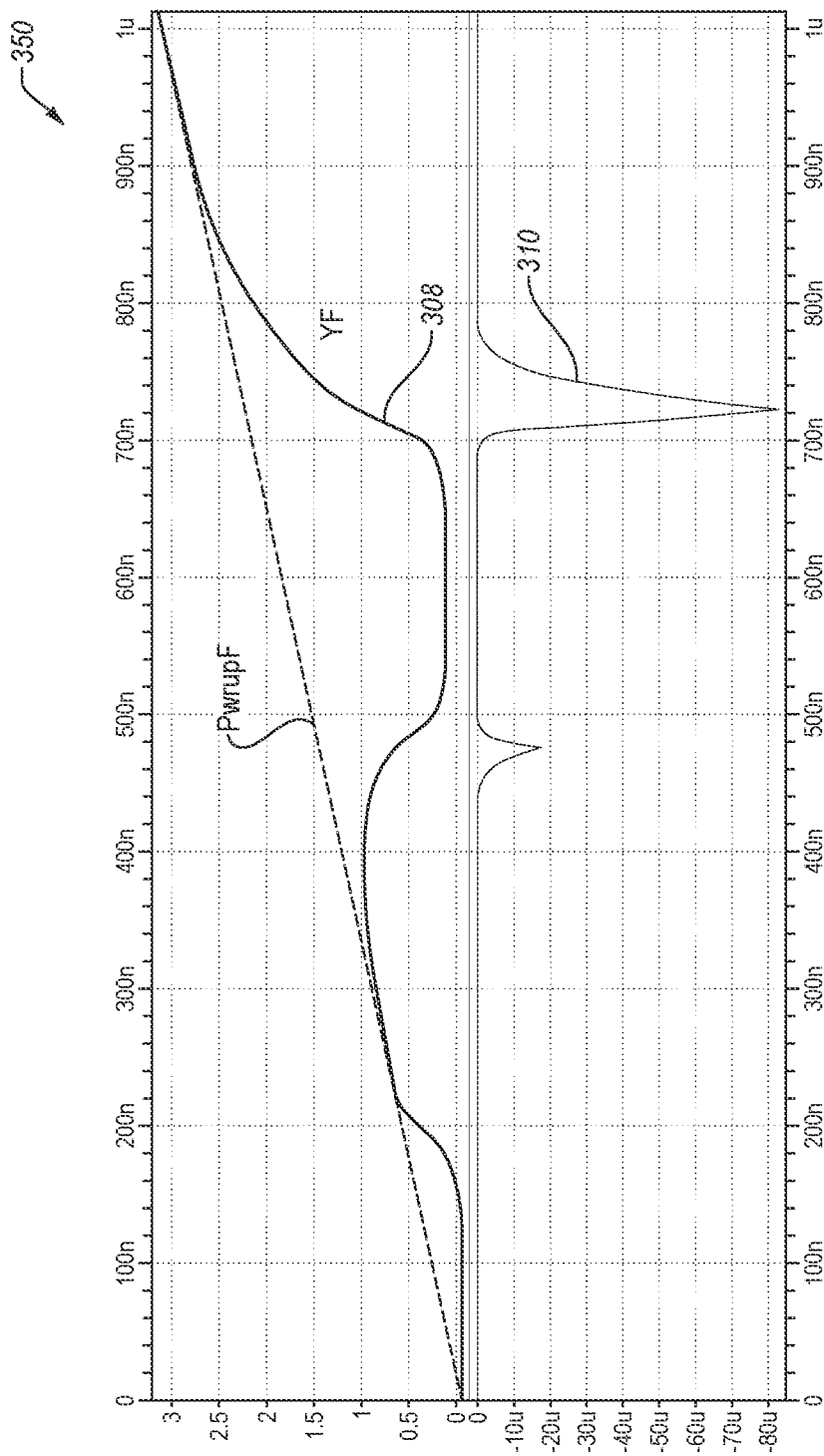
FIG. 3B is a plot depicting a power up reset signal, a signal representing the output of the level shifter of FIG. 2B, and crossing current associated with the circuitry of FIG. 2B.

However, using signal YF (i.e., as the input to inverter 203) may cause reliability issues related to crossing current at inverter 203 (see FIG. 2B) during a power up sequence. More specifically, with reference to plot 350 of FIG. 3B, in this example, a power up reset signal PwrupF (i.e., a power up reset signal received at level shifter 202 of FIG. 2B) takes a relatively long time (e.g., approximately 1 microsecond) to transition from 0 to 3 volts (i.e., supply voltage VCCP (see FIG. 2B) slowly transitions from 0 to 3 volts). Further, in this example, due to the behavior of signal YF (i.e., relative to the value of supply voltage VCCP), both PMOS transistor M0 and NMOS transistor M1 (see FIG. 2B) may turn ON, resulting in a crossing current, as indicated by signal 310. Yet more specifically, in this example, between 400 nanoseconds and 500 nanoseconds, due to the voltage of signal YF (e.g., which is at or less than 1 volt) relative to the voltage of power up reset signal PwrupF (e.g., which is between 1 and 1.5 volts), both PMOS transistor M0 and NMOS transistor M1 turn on, resulting in crossing current, as indicated by signal 310 at approximately 470 nanoseconds. Further, between 700 nanoseconds and 800 nanoseconds, due to the voltage of signal YF (e.g., which is approximately 1.5 volts) relative to the voltage of power up reset signal PwrupF (e.g., which is approximately 2.2 volts), both PMOS transistor M0 and NMOS transistor M1 turn on, again resulting in a crossing current, as indicated by signal 310 at approximately 720 nanoseconds. As will be appreciated, each row section of a main word line driver of a memory device may include circuitry 200 of FIG. 2B, and thus an amount of crossing current associated with the memory device (i.e., due to circuitry 200) may be substantial.

Figure 4:
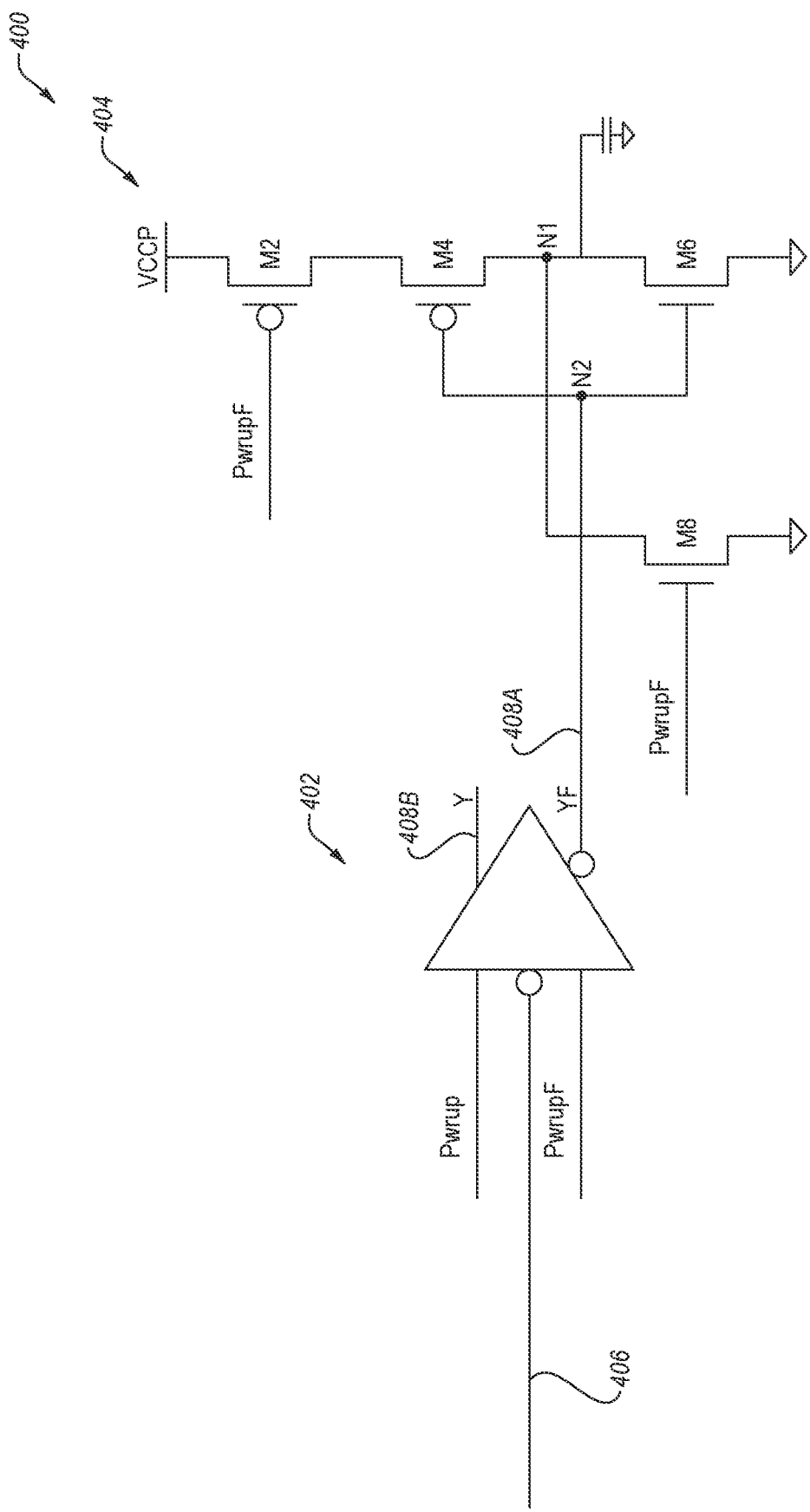
FIG. 4 depicts example circuitry including a level shifter and logic, in accordance with various embodiments of the disclosure.

FIG. 4 depicts example circuitry 400, in accordance with various embodiments of the disclosure. For example, circuitry 400 may be part of a driver, such as a main word line driver, of a memory device (e.g., memory device 100 of FIG. 1).

Circuitry 400 includes a level shifter 402 and logic 404, which includes transistors M2, M4, M6, and M8. In at least some embodiments, transistors M2 and M4 may comprise PMOS transistors and transistors M6 and M8 may comprise NMOS transistors. For example, logic 404 may include a NOR gate. In this example, the NOR gate may include the two series PMOS transistors (i.e., transistors M2 and M4) and two parallel NMOS transistors (i.e., transistors M6 and M8).

Transistor M2 includes a terminal (e.g., a source) coupled to supply voltage VCCP and another terminal (e.g., a drain) coupled to a terminal (e.g., a source) of transistor M4. Transistor M2 is configured to receive a power up reset signal PwrupF at its gate. Transistor M4 further includes another terminal (e.g., a drain) coupled to a node N1 (i.e., an output of logic 404) and a gate coupled to a node N2. Transistor M6 includes a gate coupled to node N2, a terminal (e.g., a source) coupled to node N1, and another terminal (e.g., a drain) coupled to a reference (e.g., ground voltage). Transistor M8 includes a gate configured to receive power up reset signal PwrupF, a terminal (e.g., a source) coupled to node N1, and another terminal (e.g., a drain) coupled to a reference (e.g., ground voltage).

Level shifter 402 is configured to receive a power up reset signal Pwrup, power up reset signal PwrupF, and a signal 406. Further, level shifter 402 is configured to generate signals 408A ("YF") and 408B ("Y"). For example, during operation, a voltage of signal 406 may be between 0 and 1 volt (e.g., a power supply voltage line (VPERI)), and a voltage of signal 408A may be between 0 and supply voltage VCCP (e.g., 3 volts). As will be appreciated, signal 408B is the inverse of signal 408A.

As illustrated, node N2, which is coupled between transistors M4 and M6, is configured to receive signal 408A ("YF"). More specifically, signal 408A may be received at gates of each of transistor M4 and transistor M6.

As will be understood, in the embodiment of FIG. 4, at a certain point during a power up sequence, a voltage of power up reset signal PwrupF may increase (i.e., from 0 volts to a specific voltage level) and turn OFF transistor M2, and thus regardless of whether transistor M4 is conducting, node N1 may be isolated from supply voltage VCCP (i.e., due to transistor M2 being OFF) (i.e., during at least a portion of the power up sequence). Further, at a certain point during a power up sequence, the voltage of power up reset signal PwrupF may increase (i.e., to a specific voltage level) and turn ON transistor M8 and couple node N1 to ground (i.e., during at least a portion of the power up sequence). Thus, during the power up sequence, in the event both transistor M4 and transistor M6 are ON, node N1 may be isolated from supply voltage VCCP (e.g., via transistor M2) and/or coupled to ground (e.g., via transistor M8), and therefore, crossing current may be reduced, and possibly eliminated. Further, as will be appreciated, during at least a portion of the power up sequence, signal YF may not be output from circuitry 400.

Figure 5:
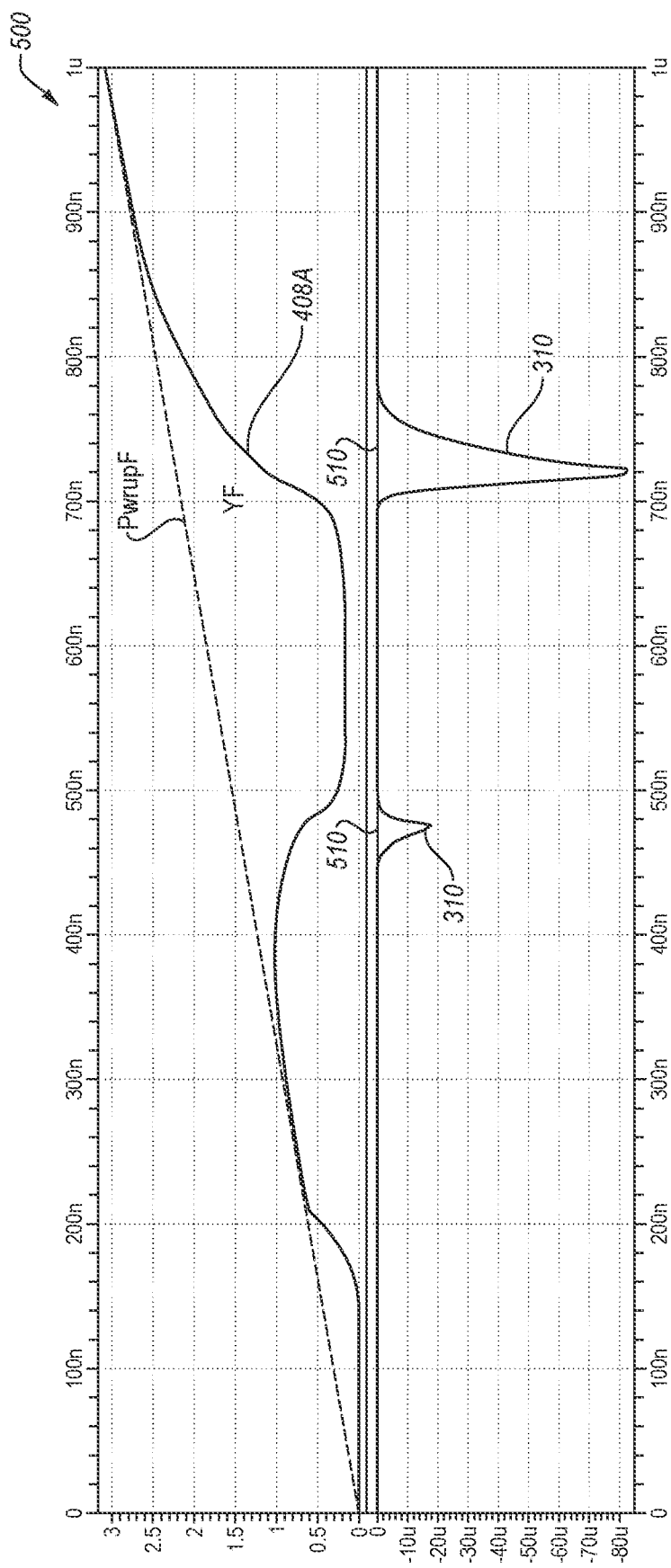
FIG. 5 is a plot including various signals associated with a power up reset signal, a signal representing an output of the level shifter of FIG. 4, and crossing current associated with the circuitry of FIG. 4.

FIG. 5 is a plot 500 including power up reset signal PwrupF (i.e., of FIG. 4), signal 408A ("YF"), and a signal 510, which is indicative of a crossing current associated with circuitry 400 of FIG. 4. Compared to crossing current 310 generated via circuitry 200 (see FIG. 2A and/or FIG. 2B), circuitry 400 does not exhibit any substantial crossing current.

Accordingly, utilizing power up reset signal PwrupF as an input to logic 404 (e.g., a NOR gate) (see FIG. 4) may mitigate crossing current associated with circuitry 400. Further, according to at least some embodiments, at least some transistor dimensions of logic 404 may be imbalanced, and thus any tRCD timing penalty may be mitigated.

Figure 6:
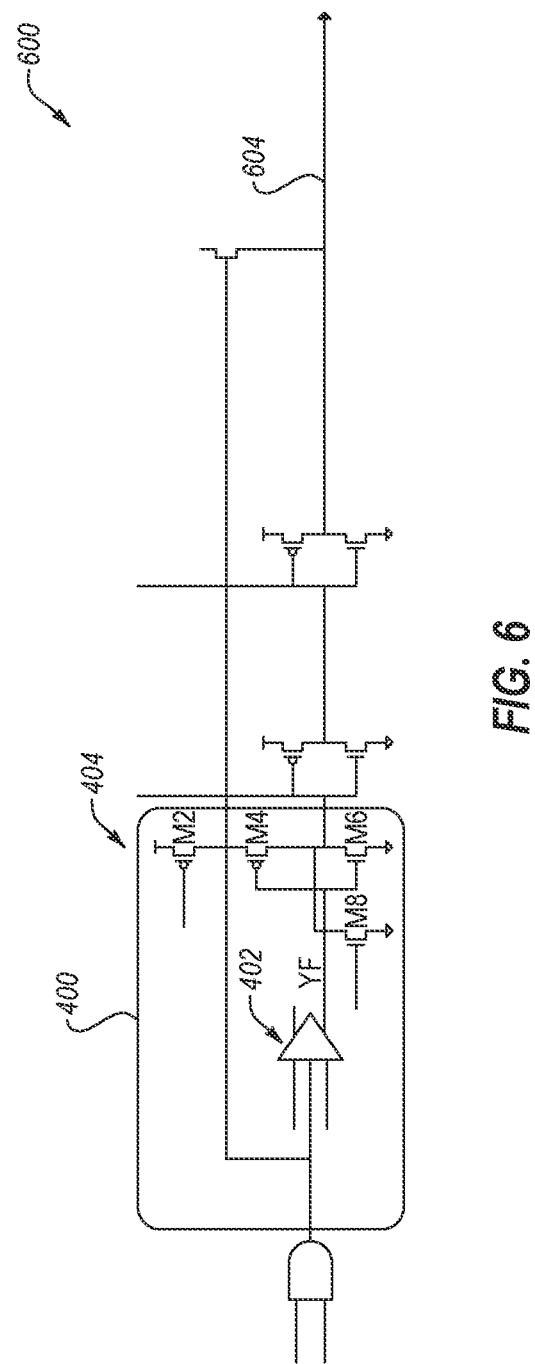
FIG. 6 depicts example circuitry of a main word line driver of a memory device, according to various embodiments of the disclosure.

FIG. 6 depicts example circuitry 600 of a main word line driver, according to various embodiments of the disclosure. For example, one or more decoders of a memory device (e.g., memory device 100 of FIG. 1) may include circuitry 600. According to various embodiments, circuitry 600 includes circuitry 400 of FIG. 4, including level shifter 402 and logic 404 (e.g., including a NOR gate having transistors M2, M4, M6, and M8). Circuitry 600 may be configured for generating a control signal 604, which may be used to drive one or more main word lines of the memory device (e.g., memory device 100 of FIG. 1). As will be appreciated, a main word line driver of a memory device may include additional circuitry not shown in FIG. 6.

Figure 7:
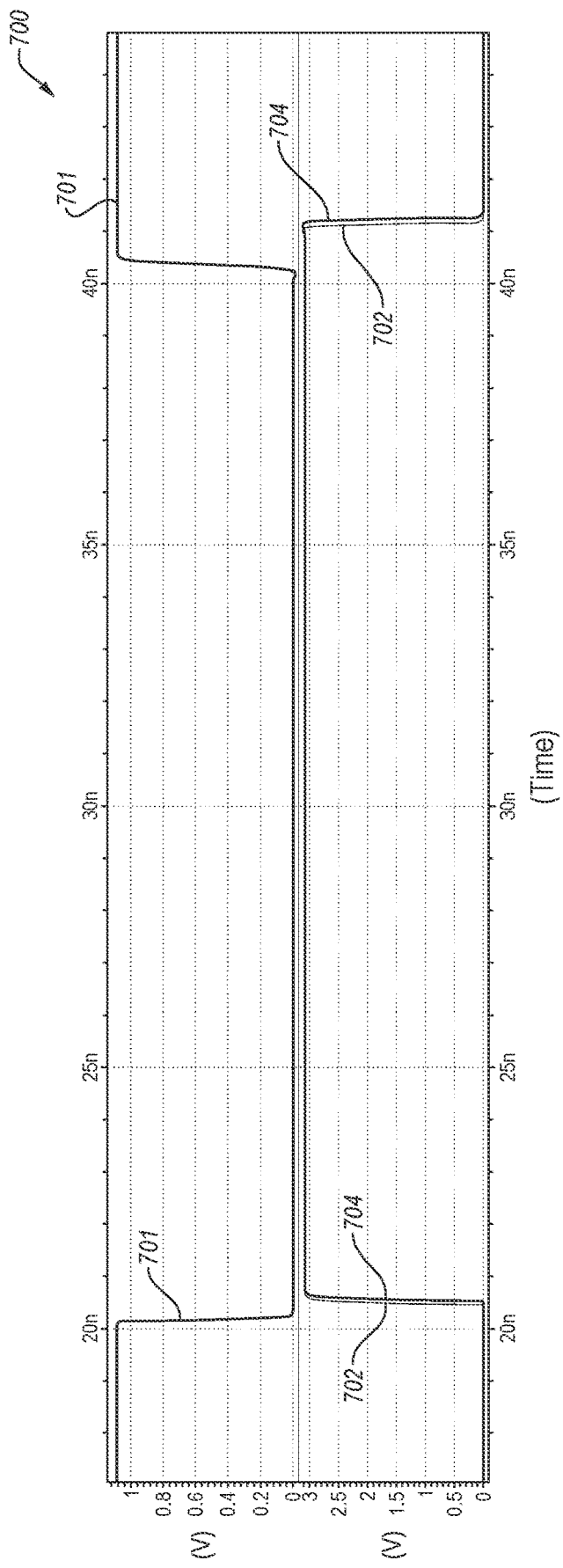
FIG. 7 is a plot including various signals associated with the circuitry of FIG. 6.

FIG. 7 is a plot 700 including a signal 701, which represents an input (e.g., signal 406 of FIG. 4) of level shifter 402, and a control signal 704, which represents an output generated by circuitry 600 (e.g., control signal 604 of FIG. 6). Plot 700 further includes a control signal 702, which represents an output generated via circuitry 200 of FIG. 2 (e.g., signal 204 of FIG. 2A). As will be appreciated, the timing difference between control signal 702 and control signal 704 is negligible (e.g., a tRCD path delay of approximately 33.4 picoseconds and a tRP path delay of approximately 104 ps), and thus circuitry 400 may meet various design, operation, and/or specification requirements (e.g., tRCD and tRP timing requirements).

With reference again to FIG. 4, it will be appreciated that, in at least some embodiments, upon completion of a power up sequence and during operation of circuitry 400, transistor M2 may be ON and transistor M8 may be OFF. Thus, after a power up sequence and during operation of circuitry 400, logic 404 may operate the same as or similar to inverter 203 of FIG. 2B.

According to various embodiments, logic 404 may be formed and/or packaged as a sub cell (e.g., of a semiconductor device). Further, according to some embodiments, level shifter 402 and logic 404, which may positioned adjacent one another, may be packaged and/or encapsulated together as a level shifting component. Moreover, for example, a method of manufacturing a device (e.g., a level shifting component) may include forming, via a number of transistors (e.g., PMOS and NMOS transistors) and an inverter, a level shifter (e.g., level shifter 402 of FIG. 4). The method may also include forming, via a number of transistors (e.g., PMOS and NMOS transistors), logic (e.g., a NOR gate) (e.g., logic 404 of FIG. 4). Further, the method may include packaging and encapsulating the level shifter and the logic together (e.g., to form a level shifting component).

Figure 8:
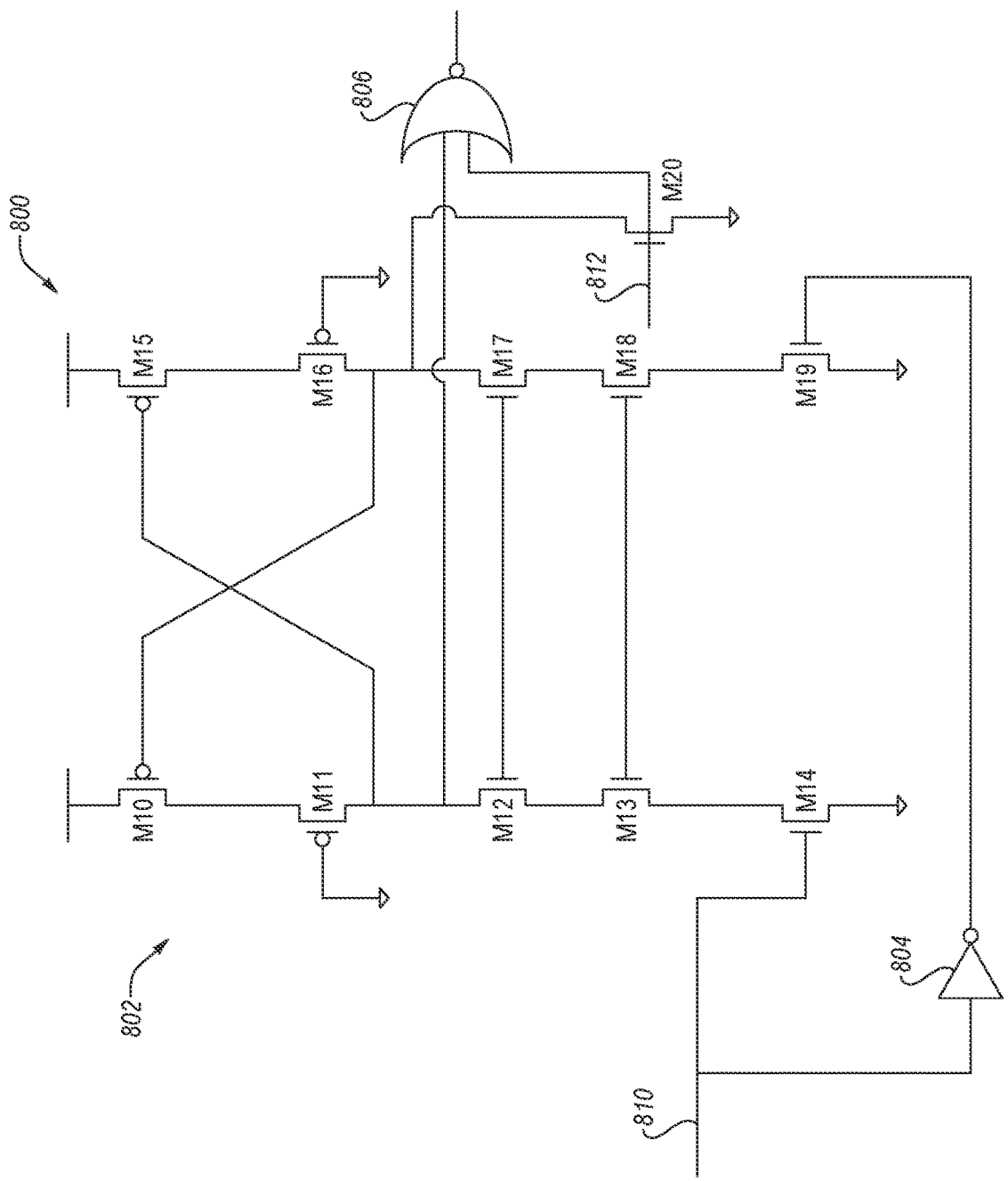
FIG. 8 depicts example circuitry, according to various embodiments of the disclosure.

FIG. 8 depicts example circuitry 800, according to various embodiments of the disclosure. For example, circuitry 800 may be an example implementation of circuitry 400 of FIG. 4. Circuitry 800 includes a level shifter 802 including an inverter 804. Level shifter 802 includes transistors M10-M19, wherein transistors M10, M11, M15, and M16 are PMOS transistors and transistors M12, M13, M14, M17 M18, and M19 are NMOS transistors. Level shifter 802 is configured to receive an input signal 810. For example, level shifter 402 of FIG. 4 may include level shifter 802.

Circuitry 800 further includes a NOR gate 806, and a transistor M20, which may be, for example, an NMOS transistor. For example, logic 404 of FIG. 4 may include NOR gate 806 and possibly transistor M20.

As depicted, transistor M20 is configured to receive a signal 812, which may include a power up reset signal (e.g., power up reset signal PwrupF; see FIG. 4) at its gate. As will be appreciated, transistor M20 may be used to couple one output (e.g., signal Y of FIG. 4) of level shifter 802 to ground. Further, one input of NOR gate 806 is coupled to another output (e.g., signal YF of FIG. 4) of level shifter 802, and another input of NOR gate 806 is configured to receive signal 812.

Figure 9:
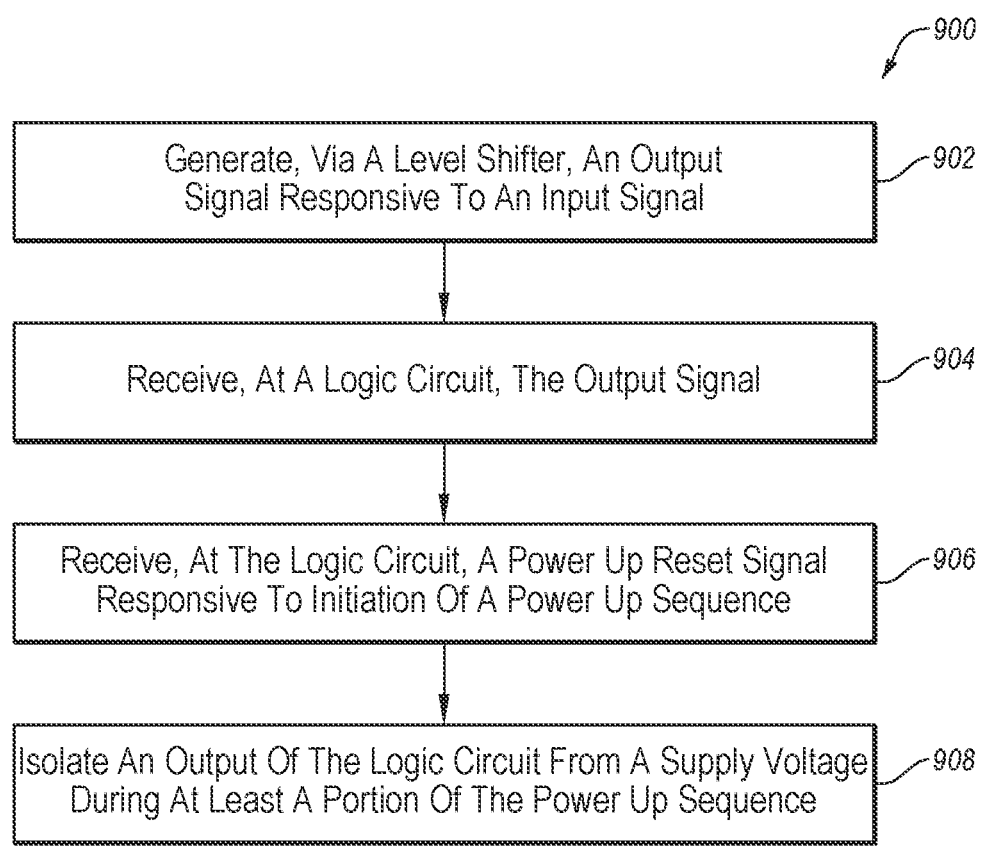
FIG. 9 is a flowchart of an example method of operating a semiconductor device, in accordance with various embodiments of the disclosure.

FIG. 9 is a flowchart of an example method 900 of operating a semiconductor device, in accordance with various embodiments of the disclosure. Method 900 may be arranged in accordance with at least one embodiment described in the disclosure. Method 900 may be performed, in some embodiments, by a circuit, a device, or a system, such as memory device 100 of FIG. 1, circuitry 400 of FIG. 4, circuitry 600 of FIG. 6, circuitry 800 of FIG. 8, memory device 1000 of FIG. 10, and/or electronic system 1100 of FIG. 11, or another device or system. Although illustrated as discrete blocks, various blocks may be divided into additional blocks, combined into fewer blocks, or eliminated, depending on the desired implementation.

Method 900 may begin at block 902, wherein, a level shifter may generate an output signal responsive to an input signal, and method 900 may proceed to block 904. For example, the level shifter may include level shifter 402 (see FIG. 4 and/or FIG. 6), the output signal may include signal 408A ("YF") (see FIG. 4 and/or FIG. 6) and the input signal may include signal 406 (see FIG. 4).

At block 904, the output signal may be received at a first node of a logic circuit, and method 900 may proceed to block 906. For example, the logic circuit, which may include logic 404 (see FIG. 4 and/or FIG. 6), may include a NOR gate. Further, for example, the first node may include node N2 shown in FIG. 4.

At block 906, a power up reset signal may be received at the logic circuit responsive to initiation of a power up sequence, and method 900 may proceed to block 908. For example, the power up reset signal may include power up reset signal PwrupF (see FIG. 4). For example, the power up reset signal may be received at a gate of one or more transistors of the logic circuit (e.g., transistors M2 and/or transistors M8 of FIG. 4).

At block 908, an output of the logic circuit may be isolated from a supply voltage during at least a portion of the power up sequence. For example, with reference to FIG. 4, PMOS transistor M2 may turn OFF (e.g., responsive to a voltage level of power up reset signal PwrupF increasing to a sufficient level) to isolate supply voltage VCCP from the output (e.g., node N1) of the logic circuit.

Modifications, additions, or omissions may be made to method 900 without departing from the scope of the disclosure. For example, the operations of method 900 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, method 900 may include one or more acts wherein the output of the logic circuit (e.g., node N1 of FIG. 4) may be coupled to ground (e.g., responsive to a voltage level of power up reset signal PwrupF increasing to a sufficient level to turn ON transistor M8).

A memory device is also disclosed. According to various embodiments, the memory device may include one or more memory cell arrays, such as memory cell array 102 (see FIG. 1). The one or more memory cell arrays may include a number of memory cells.

Figure 10:
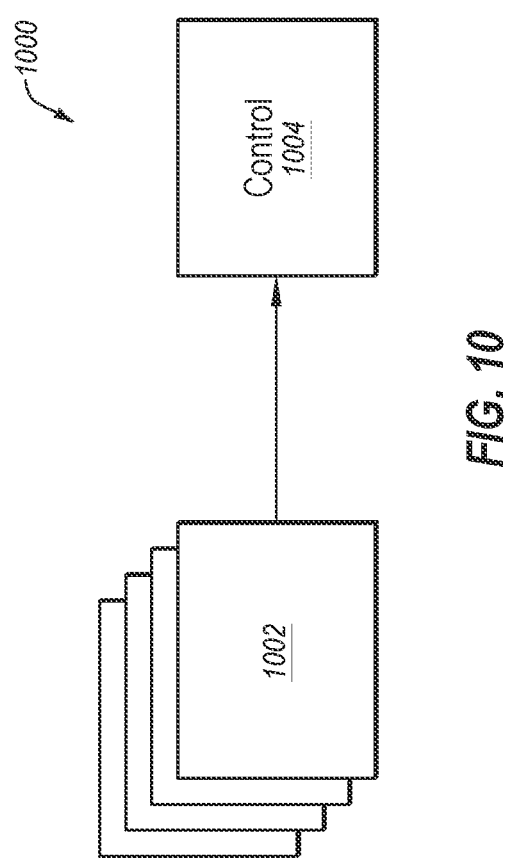
FIG. 10 is a simplified block diagram of an example memory device, in accordance with various embodiments of the disclosure.

FIG. 10 is a simplified block diagram of a memory device 1000 implemented according to one or more embodiments described herein. Memory device 1000, which may include, for example, a semiconductor device, includes a memory array 1002 and control 1004. Memory array 1002, which may include a number of memory banks, may include a number of memory cells.

Control 1004 may be operatively coupled with memory array 1002 so as to read, write, or refresh any or all memory cells within memory array 1002. Control 1004 may be configured for carrying out one or more embodiments disclosed herein. For example, in some embodiments, control 1004 may include at least a portion of, for example, circuitry 400 of FIG. 4, circuitry 600 of FIG. 6, and/or circuitry 800 of FIG. 8.

A system is also disclosed. According to various embodiments, the system may include a memory device including a number of memory banks, each memory bank having an array of memory cells. Each memory cell may include an access transistor and a storage element operably coupled with the access transistor.

Figure 11:
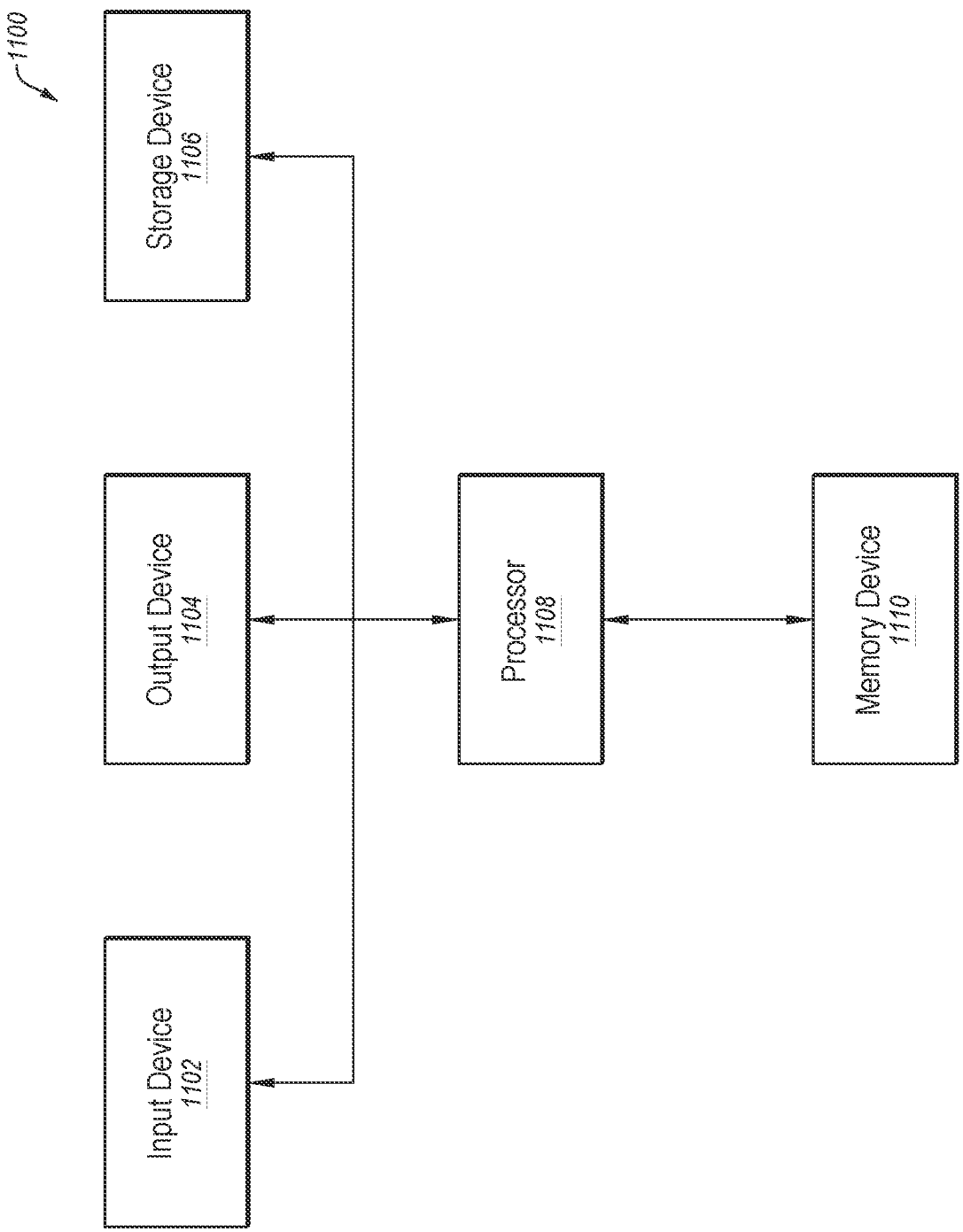
FIG. 11 is a simplified block diagram of an example electronic system, in accordance with various embodiments of the disclosure.

FIG. 11 is a simplified block diagram of an electronic system 1100 implemented according to one or more embodiments described herein. Electronic system 1100 includes at least one input device 1102, which may include, for example, a keyboard, a mouse, or a touch screen. Electronic system 1100 further includes at least one output device 1104, such as a monitor, a touch screen, or a speaker. Input device 1102 and output device 1104 are not necessarily separable from one another. Electronic system 1100 further includes a storage device 1106. Input device 1102, output device 1104, and storage device 1106 may be coupled to a processor 1108. Electronic system 1100 further includes a memory device 1110 coupled to processor 1108. Memory device 1110, which may include memory device 1000 of FIG. 10, may include an array of memory cells. Electronic system 1100 may include, for example, a computing, processing, industrial, or consumer product. For example, without limitation, electronic system 1100 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the disclosure may include a device including a level shifter including an at least one input and at least one output. The device may also include a logic circuit coupled to an output of the at least one output of the level shifter. The logic circuit may be configured to receive a power up reset signal responsive to a power up sequence. The logic circuit may also be configured to isolate, during at least a portion of the power up sequence, an output of the logic circuit from a supply voltage responsive to the power up reset signal.

One or more other embodiments of the disclosure include a method of operating a memory device. The method may include generating, via a level shifter, an output signal responsive to an input signal. The method may further include receiving, at a first node of a logic circuit, the output signal, and receiving, at the logic circuit, a power up reset signal responsive to initiation of a power up sequence. Further, the method may include isolating an output of the logic circuit from a supply voltage during at least a portion of the power up sequence.

Additional embodiments of the disclosure include an electronic system. The electronic system may include at least one input device, at least one output device, and at least one processor device operably coupled to the input device and the output device. The electronic system may also include at least one memory device operably coupled to the at least one processor device and including a main word line driver. The main word line driver may include a level shifter including an input and an output. The main word line driver may also include a first transistor having a first terminal coupled to a voltage supply and a gate configured to receive a power up reset signal. The main word line driver may also include a second transistor having a gate coupled to the output of the level shifter, a first terminal coupled to a second terminal of the first transistor and a second terminal coupled to a node. The main word line driver may also include a third transistor having a gate coupled to the output of the level shifter, a first terminal coupled to node, and a second terminal coupled to a reference voltage. Further, the main word line driver may include a fourth transistor having a gate configured to receive the power up reset signal, a first terminal coupled to the node, and a second terminal coupled to the reference voltage.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   a level shifter including an at least one input and at least one output; and
   a logic circuit coupled to an output of the at least one output of the level shifter and configured to:
      receive, independent of the level shifter, a power up reset signal responsive to a power up sequence;
      isolate, during at least a portion of the power up sequence, an output of the logic circuit from a supply voltage responsive to the power up reset signal; and
      couple, after the power up sequence, the output of the logic circuit to the supply voltage in response to a signal at the output of the level shifter.

2. The device of claim 1, wherein logic circuit comprises:
   a first transistor having a first terminal coupled to the supply voltage and a gate configured to receive the power up reset signal;
   a second transistor having a gate coupled to the output of the level shifter, a first terminal coupled to a second terminal of the first transistor and a second terminal coupled to a node;
   a third transistor having a gate coupled to the output of the level shifter, a first terminal coupled to the node, and a second terminal coupled to a reference voltage; and
   a fourth transistor having a gate configured to receive the power up reset signal, a first terminal coupled to the node, and a second terminal coupled to the reference voltage.

3. The device of claim 2, wherein the first transistor and the second transistor are PMOS transistor and the third transistor and the fourth transistor are NMOS transistors.

4. The device of claim 1, wherein the level shifter is configured to receive the power up reset signal and an inverse power up reset signal.

5. The device of claim 1, further comprising a word line driver including each of the level shifter and the logic circuit.

6. The device of claim 1, wherein an output of the at least one output of the level shifter transitions from HIGH to LOW in response to an input of the at least one input of the level shifter transitioning from HIGH to LOW.

7. The device of claim 1, wherein the at least one input of the level shifter includes a first input for receiving an input signal and a second input for receiving an inverse of the power up reset signal, wherein the at least one output of the level shifter includes a first output for generating a first output signal and a second output for generating a second output signal, the second output signal being an inverse of the first output signal.

8. A method of operating a memory device, comprising:
   generating, via a level shifter, an output signal responsive to an input signal;
   receiving, at a logic circuit, the output signal;
   receiving, at the logic circuit and independent of the level shifter, a power up reset signal responsive to initiation of a power up sequence;
   isolating an output of the logic circuit from a supply voltage during at least a portion of the power up sequence; and
   coupling, after the power up sequence, the output of the logic circuit to the supply voltage based on the output signal.

9. The method of claim 8, wherein receiving, at the logic circuit, the power up reset signal comprises receiving the power up reset signal at a PMOS transistor coupled to the supply voltage.

10. The method of claim 9, wherein receiving, at the logic circuit, the power up reset signal further comprises receiving the power up reset signal at an NMOS transistor coupled to ground.

11. The method of claim 8, wherein receiving, at the logic circuit, the output signal comprises receiving the output signal at a gate of each of a PMOS transistor and an NMOS transistor.

12. The method of claim 8, wherein generating, via the level shifter, the output signal responsive to the input signal comprises generating, via the level shifter of a main word line driver, the output signal responsive to the input signal.

13. The method of claim 8, wherein isolating the output of the logic circuit from the supply voltage comprises turning OFF a PMOS transistor coupled between the output of the logic circuit and the supply voltage.

14. The method of claim 8, further comprising coupling the output of the logic circuit to ground.

15. The method of claim 8, wherein isolating the output of the logic circuit from the supply voltage comprises isolating the output of the logic circuit from the supply voltage responsive to a voltage level of the power up reset signal increasing to a level to cause a PMOS transistor coupled between the output of the logic circuit and the supply voltage to turn OFF.

16. A system, comprising:
at least one input device;
at least one output device;
at least one processor device operably coupled to the input device and the output device; and
at least one memory device operably coupled to the at least one processor device and including a main word line driver, the main word line driver including:
a level shifter including an input and an output;
a first transistor having a first terminal coupled to a voltage supply and a gate configured to receive a power up reset signal;
a second transistor having a gate coupled to the output of the level shifter, a first terminal coupled to a second terminal of the first transistor and a second terminal coupled to a node;
a third transistor having a gate coupled to the output of the level shifter, a first terminal coupled to the node, and a second terminal coupled to a reference voltage; and
a fourth transistor having a gate configured to receive the power up reset signal, a first terminal coupled to the node, and a second terminal coupled to the reference voltage.

17. The system of claim 16, the first transistor and the second transistor comprising PMOS transistor and the third transistor and the fourth transistor comprising NMOS transistors.

18. The system of claim 16, the level shifter further configured to receive the power up reset signal and an inverse power up reset signal.

19. The system of claim 16, wherein collectively the first transistor, the second transistor, the third transistor, and the fourth transistor are configured to operate as a NOR gate.

20. The system of claim 16, wherein the output of the level shifter transitions from HIGH to LOW in response to the input of the level shifter transitioning from HIGH to LOW.

\* \* \* \* \*

UNITED STATES PATENT AND TRADEMARK OFFICE
CERTIFICATE OF CORRECTION

| | | |
|---|---|---|
| PATENT NO. | : 12,165,693 B2 | Page 1 of 1 |
| APPLICATION NO. | : 17/457570 | |
| DATED | : December 10, 2024 | |
| INVENTOR(S) | : Hiroshi Akamatsu and Yantao Ma | |

It is certified that error appears in the above-identified patent and that said Letters Patent is hereby corrected as shown below:

On the Title Page
In Item (54)    Line 2,    change "AND LOGIC, CONFIGURED TO RECEIVE A"
to --AND LOGIC CONFIGURED TO RECEIVE A--

In the Specification
Column 1,    Line 2,    change "AND LOGIC, CONFIGURED" to --AND LOGIC CONFIGURED--
Column 3,    Line 29,    change "BL) and/BL, and a" to --BL) and /BL, and a--
Column 3,    Line 31,    change "BL and/BL. The selection" to --BL and /BL. The selection--
Column 3,    Line 33,    change "BL and/BL may be performed" to --BL and /BL may be performed--
Column 3,    Line 39,    change "BL and/BL are coupled" to --BL and /BL are coupled--
Column 3,    Line 40,    change "BL or/BL may be" to --BL or /BL may be--
Column 3,    Line 49,    change "line BL or/BL." to --line BL or /BL.--
Column 4,    Line 10,    change "signal RAY may" to --signal R/W may--
Column 4,    Line 29,    change "signals CK and/CK may be" to --signals CK and /CK may be--

Signed and Sealed this
Eleventh Day of February, 2025

Coke Morgan Stewart
*Acting Director of the United States Patent and Trademark Office*